Oct. 17, 1967 D. R. VON RECKLINGHAUSEN 3,348,155

OSCILLATOR-CONVERTER APPARATUS EMPLOYING FIELD EFFECT TRANSISTOR WITH NEUTRALIZATION AND SQUARE LAW OPERATION

Filed Feb. 10, 1966

INVENTOR
DANIEL R. VON RECKLINGHAUSEN

BY Rines and Rines

ATTORNEYS

United States Patent Office 3,348,155
Patented Oct. 17, 1967

3,348,155

OSCILLATOR-CONVERTER APPARATUS EMPLOYING FIELD EFFECT TRANSISTOR WITH NEUTRALIZATION AND SQUARE LAW OPERATION

Daniel R. von Recklinghausen, Arlington, Mass., assignor to H. H. Scott, Inc., Maynard, Mass., a corporation of Massachusetts Filed Feb. 10, 1966, Ser. No. 537,253
10 Claims. (Cl. 325—451)

ABSTRACT OF THE DISCLOSURE

Multi-signal circuits, such as an oscillator-converter, employing field-effect transistors. A relatively high impedance source is connected to the gate electrode and a relatively low impedance source, which may be part of the oscillating circuit, is connected to the source electrode. A neutralizing feedback path ensures effective grounding of the gate electrode for the oscillations. A diode connected to the source electrode, which may be associated with AGC, ensures operation of the FET within the square law portion of its operating characteristic.

Figures 1, 2, 3:
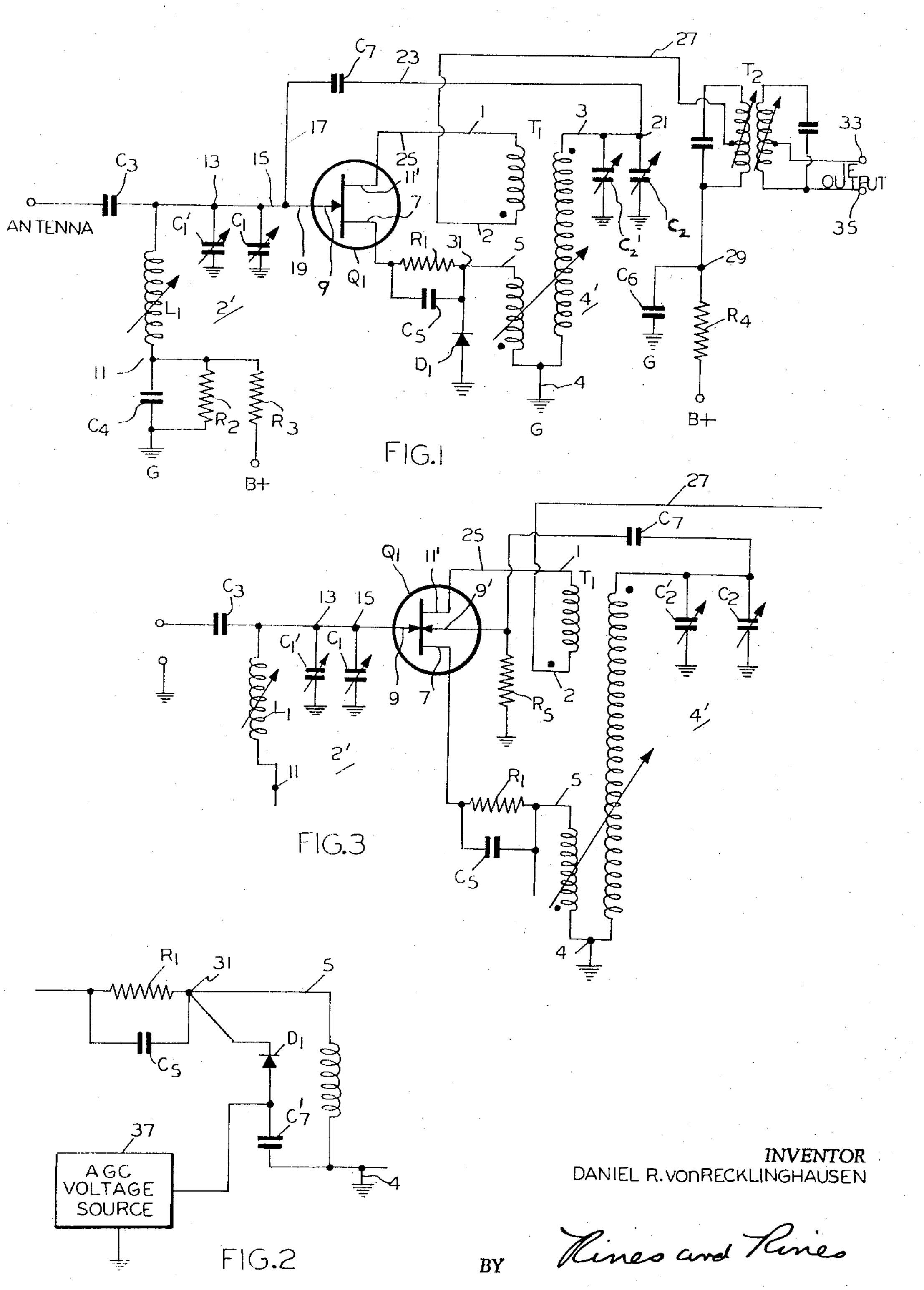

The present invention relates to multi-signal circuits including converter apparatus, being more particularly directed to oscillator-converter circuits adapted for use in such applications as AM broadcast receivers, although the principles of the invention are equally applicable for other frequency ranges and receiving systems.

For many years, oscillator-converter circuits have been employed in receivers, usually employing a triode-pentode, a triode-hexode, or a pentagrid tube, with one section, usually the triode, employed as a local oscillator of a superheterodyne receiver, and with the other section operating as a mixer. In the mixer, the local oscillator frequency and the input radio frequency generate the intermediate frequency due to a non-linear transfer characteristic of the mixer itself. In such systems, it is relatively convenient to adjust the amount of local oscillator signal injection so that a good compromise is reached between conversion gain and the ability to handle large input signals. These circuits, however, are of relatively high complexity and do not readily lend themselves to be easily converted to transistor circuits.

Consequently, and also in the interest of economy of parts, a single transistor oscillator-mixer circuit has, therefore, become widely utilized in receivers adapted for use in the standard AM broadcast band, usually operating as a grounded base oscillator with the incoming signal applied to the base of the transistor and an intermediate-frequency transformer connected between the DC supply voltage and the collector circuit of the transistor. Although quite economical in parts, this circuit has a number of severe disadvantages. First, the level of oscillation is such that the transistor alternates between full conduction and complete cutoff. This, in itself, creates high order difference and sum frequencies, aside from the one sum or difference frequency desired for proper converter action. Secondly, since the input impedance of a transistor has exactly the same non-linearity as a diode fabricated of the same type of semiconductor material as the transistor itself, sum and difference frequencies of several orders are created by the various incoming radio frequencies themselves, giving further increase in spurious responses. In relatively insensitive AM broadcast receivers, intended primarily for the reception of local stations, such spurious responses may be of little consequence. For receivers intended to operate with a larger variety of signal strengths, however, such as commonly used in automobiles, these spurious responses have been of a severe enough nature so that one or more additional selective circuits tuned to the incoming signal, along with a radio frequency amplifier in an automatic gain control circuit have had to be used to overcome this problem.

An object of the present invention, accordingly, is to provide a new and improved solid-state converter apparatus that overcomes the above-mentioned problems and disadvantages, and without the necessity for additional selective circuits or automatic gain control circuits ahead of the input.

Use is made of the fact that a field-effect transistor, and the like, has a transfer characteristic which very nearly follows the square law. A square-law characteristic means that only the sum frequency, difference frequency, the fundamental and the second harmonic of the two input frequencies are obtained in the output, along with an additional DC output. Such a square-law characteristic is ideal for mixer or converter applications because the difference frequency is the one most commonly used as the intermediate frequency in a superheterodyne receiver. The absence of higher order, such as third harmonic and up, results in the complete absence of any spurious responses. The field-effect transistor square-law characteristic, however, does not extend over the complete range of its operating characteristic curve, but has two points beyond which the square-law response does not hold. One of these two points is located where the current is almost completely cut off, and the other, where the input terminal electrode, known as the gate, begins to draw an increasing amount of current due to a forward diode characteristic.

In order to utilize such a field-effect transistor as a converter, thus, it is necessary to adjust the local oscillator signal level to such a magnitude that its peak-to-peak value is equal to or less than the two limits described above. This can be readily done if a separate oscillator is used, but it has not heretofore been feasible with a self-oscillating converter circuit. The level of oscillation, furthermore, can also be adjusted so that the sum of the mixer input signal and the oscillator signal are equal to the permissible square law signal level. This means that with a reduction of level of oscillation to one-half of the possible mixing value, input signals of the same value as the oscillator signal can be accommodated without generation of spurious responses.

An object of the present invention, therefore, is to provide a new and improved combined oscillator-converter circuit embodying a field-effect transistor, and the like, in which relatively large signals can be handled without spurious responses while eliminating the need for additional selective circuits and one or more automatic gain control stages ahead of it. The provision of a novel adjustment of oscillation level of such a self-oscillating converter is a further object of this invention. This new and improved oscillator-converter circuit for receivers and the like is thus not subject to the above-mentioned disadvantages and limitations of existing circuits, but, on the contrary, is adapted for use over wider frequency bands and without significant adjustments.

A further object is to provide a novel self-oscillating converter of more general utility, as well.

Other and further objects will be later described and are more particularly delineated in the appended claims.

The invention will now be described with reference to the accompanying drawing, FIGURE 1 of which is a schematic circuit diagram illustrating a preferred embodiment of the invention, illustratively shown as adapted for AM broadcast receivers; and FIGURE 2 is a fragmentary diagram of a modification; and FIGURE 3 is a schematic diagram of a further circuit modification.

Referring to the drawing, the input signal is obtained either from an external antenna by way of coupling capacitor C3 connected to node 13, or by means of a loop antenna L1 also connected to node 13. The other end of the loop antenna L1 is effectively by-passed to ground G at node 11 by way of capacitor C4. The inductance of L1 with the tuning capacitor C1, a trimmer capacitor C1′, and input coupling capacitor C3 form a resonant circuit 2′ tuned to the desired input frequency. Field-effect transistor Q1, having a source electrode 7, a gate electrode 9, and a drain electrode 11, is used as the one active device in this circuit.

The input signal of resonant circuit 2′ is connected from node 13 by way of conductors 15 and 19 to the gate electrode 9 of field-effect transistor Q1. Since a field-effect transistor has a very high input impedance and since the optimum source impedance of such a transistor's best noise figure is very high, the resonant impedance of input circuit 2′ is also of high impedance, say of the order of hundreds of thousands of ohms in the AM broadcast band example later given. It will be noted that this circuit does not require a stepdown transformer customarily employed with ordinary oscillator-converter circuits utilizing transistors.

Resistors R3 and R2, connected to the supply voltage source B+, form a voltage divider which applies operating bias by way of L1 and conductors 15 and 19 to the gate electrode 9 of field-effect transistor Q1. The junction 11 of resistors R2 and R3 is effectively grounded for high frequencies by way of capacitor C4.

The operating current of field-effect transistor Q1 is stabilized by having source electrode 7 connected in series with resistor R1, and with winding 5, 4 of transformer T1 to ground G. Resistor R1 is effectively a short circuit at high frequencies having capacitor C5 connected in parallel with it.

The oscillator circuit is in effect connected to source electrode 7 and drain electrode 11′ of field-effect transistor Q1, with gate electrode 9 effectively grounded, and operates, therefore, as a common-gate oscillator circuit. The inductance of winding 3, 4 of oscillator transformer T1, connected to a common node 21 and tuning capacitor C2 and trimmer capacitor C2′, form a resonant circuit 4′ tuned to the local oscillator frequency. In the circuit shown here, the input circuit 2′ resonates, for example, between frequencies of 530 and 1630 kc. and oscillator circuit 4′ resonates between frequencies of 985 to 2085 kc., thereby utilizing an intermediate frequency of 455 kc. The resonant impedance of the source electrode circuit, thus, is relatively low, and is substantially equal to or less than the reciprocal of the transconductance of the field-effect transistor; say, for example, of the order of hundreds of ohms.

Windings 1, 2 and 4, 5 of oscillator transformer T1 are tightly coupled to winding 3, 4 and thereby provide voltages in proportion to the number of turns of each winding. The dots located near terminals 2, 3, and 4 indicate the start of the winding in the same sense of rotation, and thereby determine the relative phase of the voltages at the three windings. For purposes of oscillator analysis, it can be assumed that transformer T2, tuned to 455 kc., the intermediate frequency, is a low impedance to all other frequencies and, therefore, terminal 2 of oscillator transformer T1 is effectively grounded at high frequencies by way of conductor 27, the primary winding of IF transformer T2, node 29 and capacitor C6 connected to ground G. Supply voltage for the oscillator is obtained from terminal B+ by way of filter resistor R4, node 29, the primary winding of transformer T2, conductor 27, winding 21, of oscillator transformer T1, and conductor 25 connected to the drain electrode 11′ of transistor Q1. The current from drain electrode 11′ of field-effect transistor Q1 induces a voltage in winding

1, 2 of the oscillator transformer T1 and thereby induces a voltage in the same polarity at node 31 connected to terminal 5, and applies it to source electrode 7 by way of capacitor C5. This is positive feedback and, therefore, causes transistor Q1 to oscillate. Winding 3, 4 connected to the other two windings, resonating with capacitors C2 and C2′, controls the frequency of oscillation.

A field-effect transistor is usually of symmetrical construction and often drain and source electrodes can be interchanged without affecting the performance of a field-effect transistor. Furthermore, the inter-electrode capacitance between gate and drain is nearly equal to the capacitance between gate and source. Since gate electrode 9 is connected by way of conductors 19 and 15 to the high impedance of the resonant input circuit 2′, gate electrode 9 may not be effectively grounded for proper oscillator operation. This is particularly evident when the input circuit 2′ is adjusted for operation at the highest frequency where, in effect, the total capacitance of the circuit is customarily less than 10 times the inter-electrode capacitance between the gate and source and drain electrodes, respectively.

In order to provide more effective grounding of gate electrode 9, an out-of-phase current of approximately equal and opposite sign of that derived through the inter-electrode capacitance between source electrode 7 and gate electrode 9 is obtained from node 21 of tuned oscillator-circuit 4′ by way of conductor 23, neutralizing capacictor C7 and conductor 17, thereby resulting in the approximate absence of oscillator current at conductor 15 and oscillator voltage at node 13 of resonant input-circuit 2′. Capacitor C7 is adjusted for that minimum and, therefore, the adjustment of input circuit 2′ will not affect the oscillator frequency; and, furthermore, the oscillator will not radiate either from loop antenna L1 or the external antenna.

The primary of the intermediate frequency transformer T2 is connected in series with winding 1, 2 of oscillator transformer T1 to the drain electrode 11′ of field-effect transistor Q1, and selects the beat frequency of 455 kc. obtained from the mixing action due to non-linearity of field-effect transistor Q1 and the input and oscillator signals. The secondary of this transformer provides for further selectivity and its terminals 33 and 35 are connected to one or more intermediate frequency amplifiers with associated AM detector.

It now remains to be shown how the amplitude of oscillation is adjusted so that the field-effect transistor Q1 operates within its square-law characteristic. If no further connections were made to this circuit, the oscillations of the oscillator circuit containing transformer T1 would build up to such a value where field-effect transistor Q1 would alternate between complete cutoff and saturation as determined by supply voltage, and the eventual conduction of gate electrode 19 under forward bias conditions, and would do so at the frequency determined by tuned circuit 4′. Under such conditions, the field-effect transistor Q1 would effectively switch the input signal selected by tuned circuit 2′ and would create, as the first approximation, the intermediate frequency as selected by transformer T2. However, an input signal displaced by the intermediate frequency from any harmonic of the oscillator frequency would also create an intermediate frequency output, and, furthermore, any harmonic of the input signal created by the non-linear action of field-effect transistor Q1 would also create an intermediate frequency output when displaced from any harmonic of the oscillator frequency by the intermediate frequency. All of these are spurious responses and it can be seen from this that the square-law characteristics of a field-effect transistor are therefore not utilized. In order to utilize the square-law characteristics and their beneficial aspects of a field-effect transistor, it is necessary, therefore, to limit the amplitude of oscillation. To a small degree, resistor R1 provides such a limiting action because any increase in amplitude of oscillation creates a higher current within field-effect transistor Q1 due to its square-law action which increases the current through resistor R1 and therefore the voltage developed across it, which, in turn, provides an additional amount of reverse bias, thereby decreasing the gain of this transistor.

This effect is useable when operating with a single transistor, a single supply voltage, and a single frequency. Any change in transistor or supply voltage or operating frequency will change the amount of loop gain within this oscillator or loss within the tuned circuit, and therefore the level of oscillation would be critically dependent upon those factors.

In order to limit the level of oscillation, diode D1 is connected in parallel with the source winding 4, 5 of oscillator transformer T1. This diode D1, such as a semiconductor diode, has a relatively high impedance at small alternating voltages, and begins to conduct more heavily as the forward voltage is increased, and thereby lowering its impedance. When connected in parallel with a tuned circuit, as winding 4, 5 effectively is, being tightly coupled to the resonating circuit 4', only the average resistance of the diode at the tuned frequency is of interest. This resistance decreases approximately proportionally to the exponential of the applied alternating voltage, and therefore the excess losses in this tuned circuit 4' are approximately proportional to the exponential of the level of oscillation. These losses limit the level of oscillation to the point where the energy supplied by oscillation of field-effect transistor Q1 is is approximately equal to the loss of tuned circuit 4' and loss in diode D1. By a suitable choice of diode characteristics (either germanium or silicon) and by the alternate connection of several diodes in series, the alternating oscillator voltage at terminal 31, and therefore source electrode 7, are limited. Typically, in the case of a bonded germanium diode D1, the oscillator voltage at source electrode 7 is stabilized at approximately twice the normal forward voltage of .25 v. of a germanium diode to a total of 0.5 v. peak-to-peak at drain electrode 11'. Since the square-law region of a field-effect transistor is approximately equal to its pinch-off voltage, and for the transistor shown in the example typically is 1.5 v., input signals from tuned circuit 2' of as much as 1.0 v. peak-to-peak can be accommodated without spurious responses. Here, the 0.5 v. oscillator level and the 1.0 v. maximum signal level are then equal to the pinch-off voltage of this field-effect transistor.

From the foregoing analysis, diode D1 could also be connected in the opposite polarity to that shown in this circuit because only its alternating current behavior is utilized.

Other means, such as diodes connected to a DC reference voltage, can also be used to limit oscillation to a pre-determined level. If desired, moreover, automatic gain control may be applied as at 37, FIGURE 2, feeding, for example, the junction between diode D1 and a capacitance C'7 connecting with the ground terminal 4 of the lower primary winding 5, 4 of transformer T1. The diode bias at D1 can thus be varied, with an increase in the positive direction, for example, effecting a decrease in conversion gain, and vice versa.

Alternatively, as shown in FIGURE 3, the gate electrode may be constituted of a pair of gate electrode connections contacting different portions of the semiconductor Q1, with the relatively low impedance input signal-source connected, for example, to the gate 9 and the feedback path (through C7) to the gate 9'.

The oscillator-converter circuit of the invention, therefore, permits the construction of a high performance receiver without the need of additional protective measures such as further selective input circuits or automatic gain control amplifiers ahead of the converter. It is not intended, of course, to restrict the application of this circuit to the illustrative reception of AM broadcasts in the range of 530 and 1630 kc., because much broader applications are easily accomplished. Further modifications will occur to those skilled in the art and all such are considered to fall within the spirit and scope of the invention as defined in the appended claims.

What is claimed is:

1. A multi-signal circuit having, in combination, field-effect transistor means provided with gate, source and drain electrodes, a relatively low impedance source of alternating-current signals connected to the source electrode, a relatively high impedance source of alternating-current signals connected to the gate electrode, means for producing signals substantially out-of-phase with those of the relatively low impedance source, and a neutralizing feedback path connected between the producing means and the gate electrode and of impedance such that the out-of-phase signals are substantially equal in amplitude to the signals fed from the source electrode to the gate electrode through the inherent interelectrode capacitance therebetween.

2. A multi-signal circuit as claimed in claim 1 and in which said circuit has means for operating the transistor means substantially within the square-law portion of its operating characteristic to mix the signals.

3. A multi-signal circuit as claimed in claim 1 and in which the gate electrode comprises a pair of terminals contacting different portions of the semiconductor portion of the field-effect transistor means, the relatively low impedance source being connected to one such terminal and the feedback path to the other terminal.

4. A multi-signal circuit as claimed in claim 1 and in which the said relatively low impedance source comprises an oscillating circuit including a pair of coupled windings connected respectively to each of the source and drain electrodes and coupled to a further winding forming a tank circuit with shunt capacitance and the feedback path is connected from a point of one of the windings to said gate electrode, the feedback path effectively isolating the oscillating circuit from the gate electrode and the drain current being rendered substantially independent of the impedance level of the relatively high impedance source.

5. An oscillator-converter having, in combination, field-effect transistor means provided with gate, source and drain electrodes, a relatively high impedance source of alternating-current signals connected to the gate electrode, oscillating circuit means including a feedback path connected between the source and drain electrodes to produce oscillation signals of frequency different from that of the signals from the said relatively high impedance source, the portion of the oscillating circuit means at the said source electrode being a relatively low impedance source of said oscillation signals, and means for operating the field-effect transistor means within the substantially square-law portion of its characteristic to mix the said signals and produce a resultant converted signal.

6. An oscillator-converter as claimed in claim 5 and in which a neutralizing feedback path is provided between the oscillating circuit means and the gate electrode for applying a component of the oscillation signals thereto that is substantially out-of-phase with that at the source electrode, the neutralizing feedback path being provided with impedance adjusted such that the out-of-phase signals are substantially equal in amplitude to the oscillating signals fed from the source electrode to the gate electrode through the inherent interelectrode capacitance therebetween.

7. An oscillator-converter having, in combination, field-effect transistor means provided with gate, source and drain electrodes, a relatively high impedance source of alternating-current signals connected to the gate electrode, oscillating-circuit means connected with the source and drain electrodes to produce oscillation signals of frequency different from that of the signals from the said relatively high impedance source, the portion of the oscillating circuit means at the said source electrode being a relatively low impedance source of said oscillation signals, means for operating the field-effect transistor means within the substantially square-law portion of its characteristic to mix the said signals and produce a resultant converted signal, and means connected with the source electrode for limiting the amplitude of oscillation of the oscillating circuit means to values within cutoff and saturation of the field-effect transistor means and thus coextensive with the said square-law portion of its characteristic.

8. An oscillator-converter as claimed in claim 7 and in which the said limiting means comprises means for increasing the loading of the oscillating circuit means at the source with increase in amplitude of the oscillations produced therein, said loading increasing means comprising diode means the average conductance of which through the cycle of the said oscillations depends upon the amplitude of the same and thus generates increasing losses in the said oscillating circuit means as the amplitude of the oscillations increases.

9. An oscillator-converter as claimed in claim 8 and in which series resistance is connected with the source electrode to decrease the gain of the field-effect transistor means by increasing reverse bias in response to increased amplitude of the said oscillations.

10. An oscillator-converter as claimed in claim 8 and in which gain control signal means is connected with the said diode means.

References Cited

UNITED STATES PATENTS

| | | | |
|---|---|---|---|
| 2,901,558 | 8/1959 | Webster | 179—171 |
| 3,165,700 | 1/1965 | Birkenes | 325—451 X |
| 3,229,120 | 1/1966 | Carlson | 307—88.5 |
| 3,281,699 | 10/1966 | Harwood | 325—440 |

KATHLEEN H. CLAFFY, *Primary Examiner.*

WILLIAM C. COOPER, *Examiner.*

R. S. BELL, *Assistant Examiner.*